US005663900A

United States Patent [19]
Bhandari et al.

[11] Patent Number: 5,663,900
[45] Date of Patent: Sep. 2, 1997

[54] ELECTRONIC SIMULATION AND EMULATION SYSTEM

[75] Inventors: Narpat Bhandari, Los Gatos; Daniel R. Watkins, Saratoga, both of Calif.

[73] Assignee: Vasona Systems, Inc., Los Gatos, Calif.

[21] Appl. No.: 437,957

[22] Filed: May 9, 1995

Related U.S. Application Data

[63] Continuation-in-part of Ser. No. 119,737, Sep. 10, 1993, abandoned.

[51] Int. Cl.$^6$ ................................................. G06F 17/00
[52] U.S. Cl. ................................................................ 364/578
[58] Field of Search .................................... 364/578, 579

[56] References Cited

U.S. PATENT DOCUMENTS 5,109,353   4/1992   Sample et al. ........................... 364/579

Primary Examiner—Ellis B. Ramirez

[57] ABSTRACT

In an electronic design automation (EDA) system, various models are simulated and interfaced to certain target systems, logic analyzers, modeler, functional testers, emulators, hardware accelerators, hardware modelers, or other simulators. An add-on circuit card connects the simulator to the external systems. A computer program controls simulation start, stop, single-stepping, polling, interrupting and signal monitoring. The software program includes a model input/ouput file, a model input/output parcer, a configuration module, an address generation module, a run-time module, and a C-language module.

62 Claims, 5 Drawing Sheets

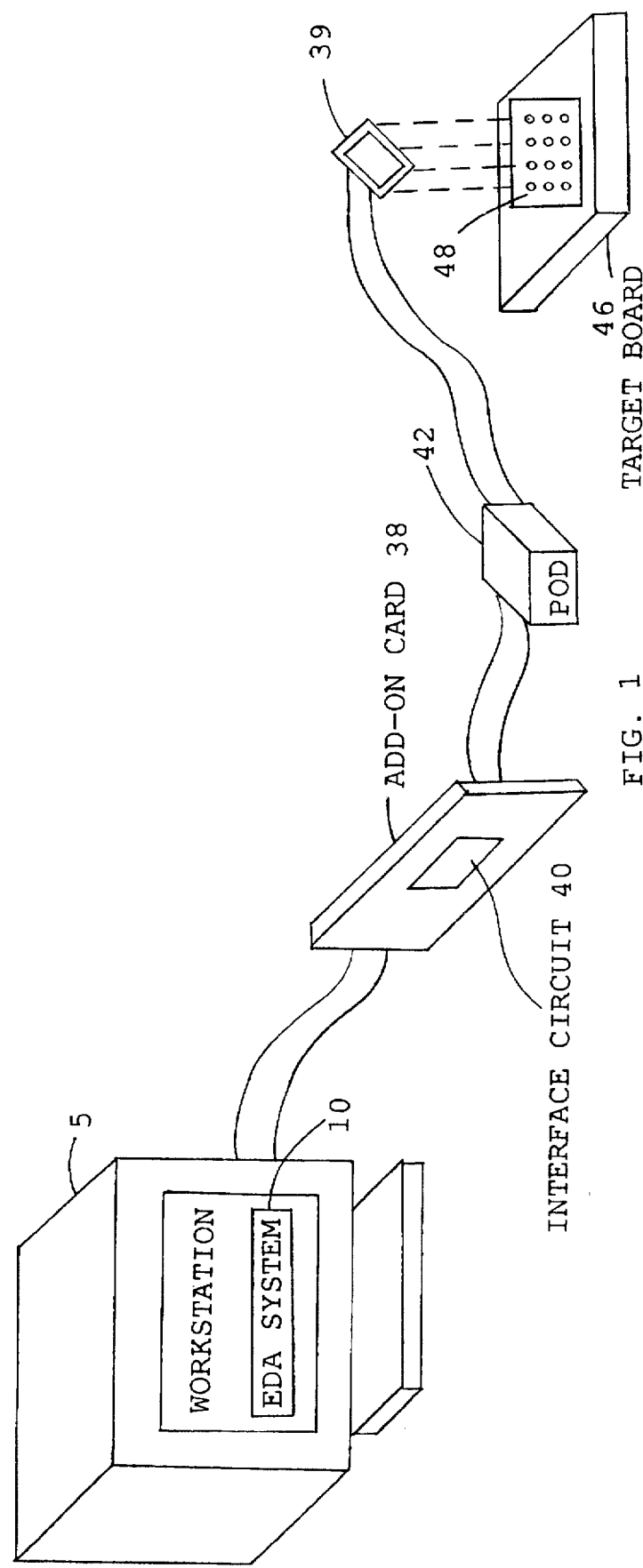

ELECTRONIC SIMULATION AND EMULATION SYSTEM

RELATED APPLICATIONS

This is a continuation-in-part of U.S. patent application Ser. No. 08/119,737, filed on Sep. 10, 1993, now abandoned.

BACKGROUND OF THE INVENTION

1. Field of the Invention

The invention relates to computer-aided engineering (CAE) tools for designing and testing electronic systems.

2. Description of the Background Art

Electronic design automation (EDA) tools are used to define and verify prototype systems, such as various application specific integrated circuits (ASICs). Typically, ASICs include digital and/or analog components, which are interconnected electrically to define certain functionality.

Conventional EDA tools provide computer-aided facilities for electronic engineers to define prototype designs, typically by generating either netlist files, which specify components and their interconnections, or hardware description files, which specify prototype system functionality according to a hardware description language (HDL).

Additionally, such EDA tools provide for early functional verification of the prototype definition, e.g., by performing simulation or emulation before a physical prototype system is actually manufactured.

Simulation generally involves executing a computer program which uses models that represent the functionality of a corresponding prototype definition or component. Thus, during simulation, each model behaves as its corresponding part, so as to generate verifiable, imitated functional or logical output signals in response to stimuli applied to the model.

Emulation is another approach for verifying prototype functionality. Through emulation, an operational, equivalent functional representation of the prototype definition is temporarily constructed, either by assembling a "bread-board" of the components and interconnections in the prototype system, or by configuring according to the prototype definition certain reprogrammable logic circuits, such as field programmable gate arrays (FPGAs). Once constructed, the emulated representation may be coupled directly to its intended target system, thereby enabling functional cooperation and verification therebetween.

Conventional simulation and emulation approaches are limited, however, to the extent that neither approach facilitates distributed verification of various, generalized prototype definitions.

SUMMARY OF THE INVENTION

The invention involves coupling an interface to a simulation tool such that distributable access is provided therefrom to various external systems, and functional cooperation is enabled between a simulated prototype definition and the external systems.

The prototype definition includes various simulation models having configurable signal pin representations, preferably provided at different levels of functional abstraction. The external systems may include other simulators, emulators, modelers, functional testers, logic analyzers or the like, which may cooperate functionally with the primary simulation facility.

The simulation interface may be implemented through add-on circuitry coupled to the processor board of the simulator. In this way, the add-on circuitry connects the prototype definition to external systems during simulation. Preferably, the add-on circuitry defines user-configurable signal paths which connect socket pins in external systems to corresponding signal pin representations in specified simulation models.

In addition, a software program is used to control simulation operations, (e.g., start, single-step, monitor, or interrupt.) The software program also includes a model input/output file, a model input/output parcer, a configuration module, an address generation module, a run-time module, and a simulator interface (typically, C-routines) module.

BRIEF DESCRIPTION OF THE DRAWING

FIG. 1 is a pictorial block diagram of an electronic design automation (EDA) system embodying the present invention.

DESCRIPTION OF THE PREFERRED EMBODIMENT

Figure 2A:
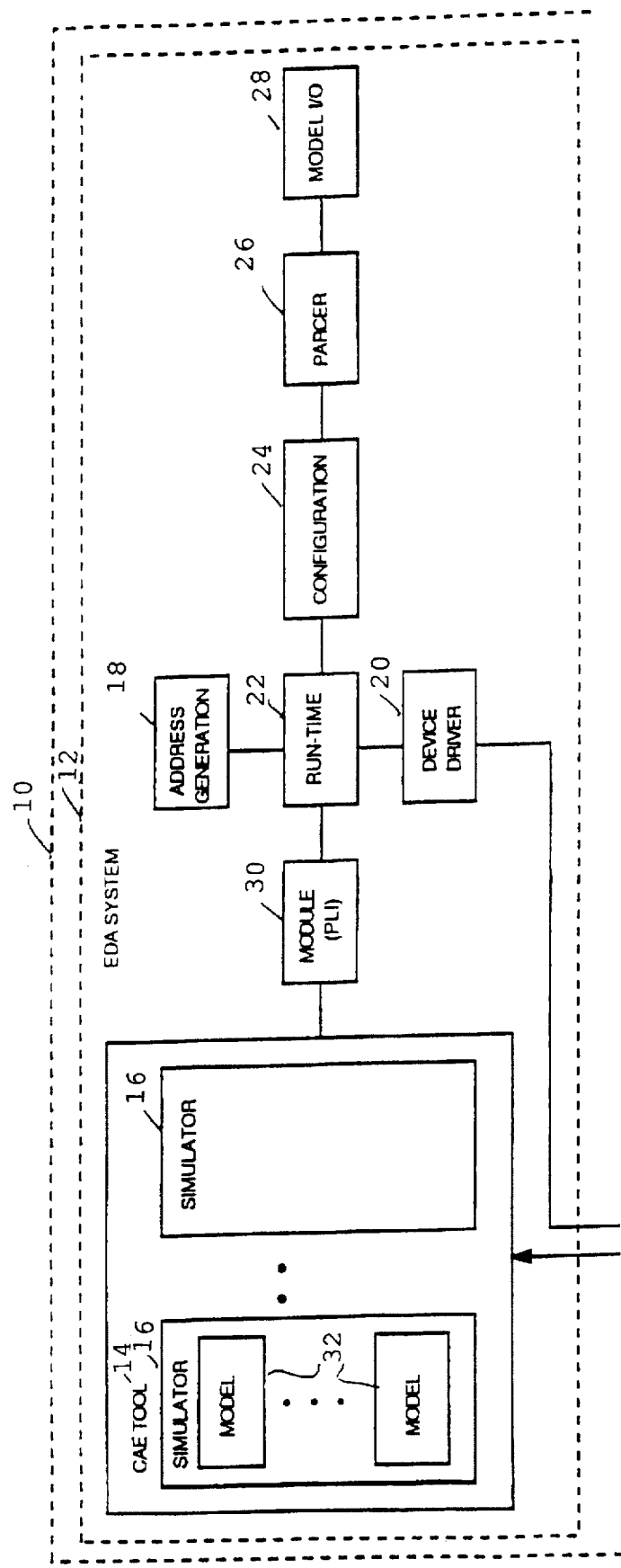
FIG. 2 shows a block diagram of EDA system of the present invention.

Referring now to FIG. 1, there is shown a preferred embodiment of computer-automated electronic design and verification system of the present invention. A conventional workstation 5 such as Sun Microsystems Sparc workstation contains (electronic design automation) EDA system 10 to provide a simulation environment with computer models to verify the functions of a prototype integrated circuits on a target system. In particular, EDA system 10 is used by electronic design engineers as an integrated hardware and/or software tool for defining and testing a prototype system or a circuit. An add-on circuit card 38 that is selected to be compatible with the workstation 5 provides a communication medium for transfer of data. In addition, the add-on circuit card 38 includes an interface circuit for interfacing with the workstation 5 and a pod 42. The pod 42 has a male plug-in socket adapter 39 where the adapter 39 connects to the female socket 48 on the target board 46.

Figure 2B:
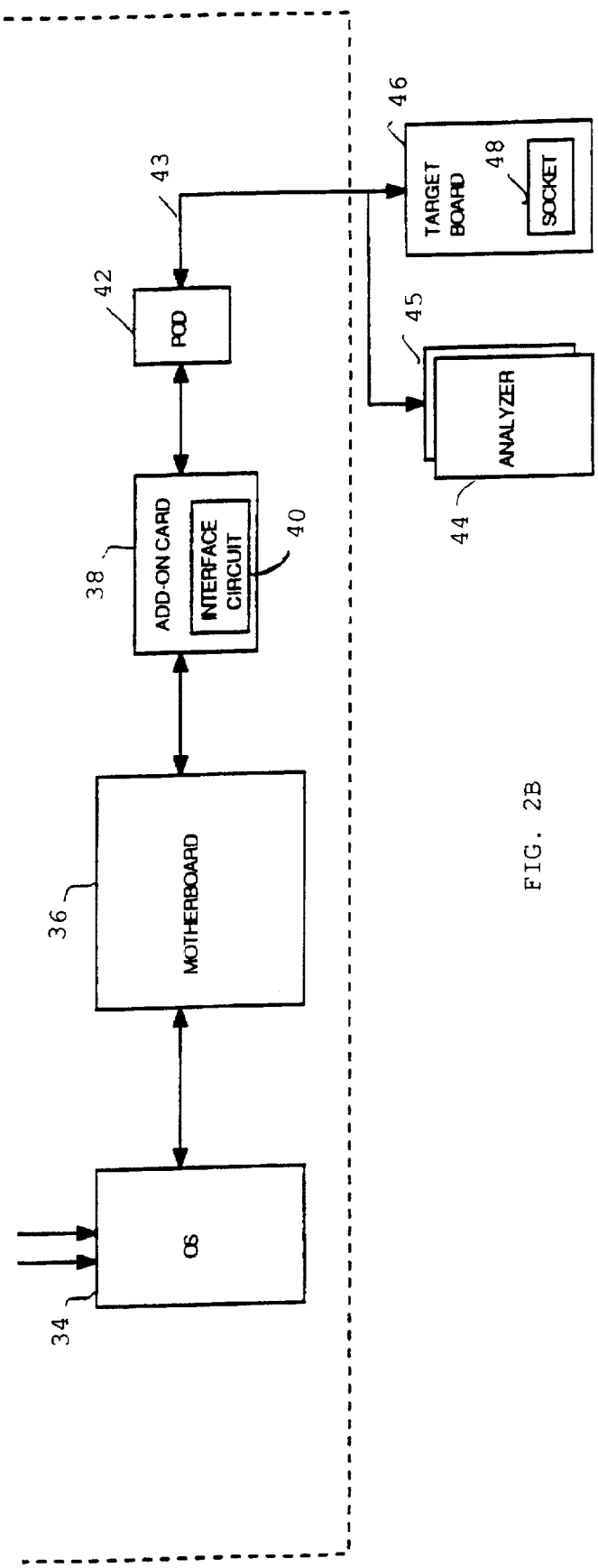

In the preferred embodiment and with reference to FIG. 2, the EDA system 10 is implemented with the operating system 34 and the motherboard 36 from a Sun Microsystems workstation and a Sbus add-on circuit card 38 which includes the interface circuit 40.

In FIG. 2, the EDA system 10 is configured substantially as an applications program which is layered to operate on operating system 34 executing on primary or "mother" board 36 of an engineering workstation or computer processor. Using conventional computer-aided engineering (CAE) techniques, CAE tool 16 in EDA system 10 is caused to generate a textual definition of the desired prototype design. The prototype textual definition is generated as a netlist file which includes electrical components and interconnections of the design, or as a hardware description file or model which defines the functionality or behavior of the design according to a hardware description language (HDL), such as VHDL or Verilog.

Prototype definition may be down-loaded or implemented functionally for equivalent operation in reconfigurable or fixed hardware or logic circuits, such as an application specific integrated circuit (ASIC), field-programmable gate array (FPGA), programmable read-only memory (PROM) or like logic circuits. Additionally, as desired by a user, the prototype definition may be revised such that system 10 is reconfigured for verifying a different prototype functionality.

EDA system 10 includes a single or multi-simulator verification or testing facility or tool 16 for simulating or emulating a functional specification of a particular prototype definition. Simulator 16 may be a conventional, digital and/or analog, stand-alone software simulator program, such as Verilog, commercially available from Cadence Design Systems and/or a hardware-based simulator/accelerator, for improving actual simulation time. Preferably, simulator 16 includes various simulation models 32. Subsystem 12 interfaces with simulator 16 to provide real-time or controlled access or signal paths between simulator 16 and external systems 44, 46. In addition, the simulator 16 can communicate with the add-on circuit card 38 by commercially available software, such as Leapfrog from Cadence Design Systems.

Interface software and hardware is provided between the simulated prototype definition 32 and external systems 44, 46 to provide distributed or multiple access paths for cooperative processing and signal processing therebetween. In this manner, specified signal paths or interconnection lines are provided, as specified by a design engineer, from CAE tool 14 to particular sockets pins or electrical contacts or nodes in particular external systems 44, 46 from particular simulator 16.

Digital and analog signals and data may be communicated between simulator 16 and external systems 44, 46, preferably according to a specified common file or vector format. Optionally, such communicated signals may be generated or stored for use as test vectors or stimulus signals.

The prototype definition includes conventional simulation files or models 32 corresponding to components, subcomponents or functional portions specified in the prototype design. Preferably, models 32 are included in memory or database for execution by simulator 16 and are provided according to specified file syntax or modeling language, programming format or interface configuration and in various levels or types of functional or logical abstraction. In particular, the prototype definition files or models include adequate descriptive information to identify uniquely signals and pin or signal path numbers through which signals are propagated or transmitted during simulation.

For example, in a mixed-level design of a system combining gate level design and behavior model design, a first model may be provided at a gate level, and a second model may be provided at a behavioral level. In addition, models 32 may define various conventional electronic components, such as digital, analog, memory, and input/output (e.g., bi-directional signal pins) components for use as standard components in gate level implementation.

External systems 44, 45, 46 may be a conventional functional tester, logic analyzer, emulator, modeler, or software or hardware-based simulator, which may cooperate functionally with, or monitor signals from, simulator 16 by transferring data signals therebetween.

For example, in a given EDA configuration, a prototype definition or simulated system may be user-partitioned in which certain physical circuit specimens or hardware models may be inserted in hardware modeler 45, certain control functions may be implemented in software models 32 in simulator 16, certain fast graphics functions may be implemented in simulation primitives in hardware accelerator 45, and certain combinatorial logic may be implemented in hardware emulation 45.

In this configuration, an interface tool according to the present invention enables simulator 16 to co-operate or functionally interact with various external systems 45 coupled thereto. External systems 44, 45, 46 may be implemented on the same or different engineering workstation or processor platforms sharing a common network link or section.

For example, external system 46 may be a second EDA/CAE facility or tool implemented on one processor for simulating a second prototype definition, and the second simulation tool may be synchronized with primary simulator 16 implemented on another processor. In this configuration, the second prototype definition functionally cooperates with the primary prototype definition during co-simulation processes running separately on both processors.

The functional cooperation between the primary simulated prototype definition and another external system is not necessarily synchronous. Thus, in an asynchronous operation, CAE tool 14 may conduct simulation essentially autonomously, without depending upon or waiting for fixed time stepping or peripheral signals from external systems 44, 45, 46.

System 10 may be a stand-alone assembly, which is functionally disconnected from an EDA workstation system or network for portable or nomadic use or operation. Alternatively, system 10 may be provided as an embedded assembly, which is dedicated for use in a particular external system 44, 45, 46.

For example, system 10 may be configured with a conventional micro-controller, such as an 8051 processor with memory, for running simulation 16 of models 32. In such a 8051 configuration, particular input/output ports or pins may be configured for signal interfacing of particular input, output, or bi-directional signal paths to particular external systems 44, 45, 46, for pin mapping between the two ports.

Interface subsystem 12 and additional circuitry are provided to enable signal communication or functional cooperation between simulator 16 and external systems 44, 45, 46, i.e., during simulation of prototype definition by simulator 16. Preferably, interface 12 provides signal channels and inter-system coupling, which are effectively user-transparent, i.e., without being encumbered by interface hardware or software set-up steps.

Thus, in this transparent manner, system 10 may appear effectively to external system 44, 45, 46 coupled thereto as a simulated or emulated prototype system, including a prototype integrated circuit and circuit boards, as defined in models accordingly in simulator 16.

To couple EDA system 10 to external systems 44, 46, add-on circuit card or board 38 couples mother board 36 to external systems 44, 46, preferably through connector pod or wiring assembly 42 connected therebetween. The connector pod 42 contains a plug-in socket 39 which has a corresponding number of pins as a socket 48 on a target board 46. Cables 41 and 43 provide user-configured signal paths of electrical lines from particular signal pins in sockets or the socket 48 in external system 44, 46 to the target board 38, and thus effectively to particular signal pins specified in the simulated prototype definition.

Preferably, interface circuit 40 includes signal switching circuits or a local processor and memory in board 38 for defining and providing uni- and bi-directional signal paths to couple electrically socket pins in external system 44, 46 to corresponding, representative socket pins in the simulated prototype definition, according to specified interconnection parameters provided to CAE tool 14 by a design engineer.

Optionally, digital-to-analog converter (DAC) or analog-to-digital converter (ADC) may also be included in interface circuit 40 to provide for analog/digital or digital/analog signal interfacing.

Also, during simulation runs by simulator 16, interface circuit 40 may provide control signals according to instructions and operations from simulator 16 to force, reset, set-up, initialize pre-determined logic states, signal conditions in components, circuits, interface pins, or simulation models thereof, in external system 44, 45, 46 which interfaces to system 10. Such control signals may be provided similarly by simulation models 32 running in simulator 16 in external systems 44, 45, 46.

As needed, interface circuit 40 in add-on board 38 may configure additional signal paths or interface pins for coupling or providing direct access of the control signals to external systems 44, 45, 46.

The control signals may be provided at pre-determined actual or simulated elapsed times. Upon detection by CAE tool 14, simulator 16, or interface circuitry 38, 42, the control signals may be provided at pre-determined signal levels at certain signal paths through which system 10 is coupled to external systems 44, 45, 46.

Furthermore, to compensate for undesirable parasitic effects which may arise from lengthy signal lines, CAE tool 14 causes interface circuit 40 and pod 42 to determine an estimated signal path delay for each defined signal paths.

One technique for determining an elapsed time involves, first, mother board 36 monitors an actual or real-time value from a system clock, possibly located on mother board 36; secondly, transmitting a test signal from CAE tool 14 or simulator 16 to interface circuitry 38, 42; then, monitoring an incremented value from the system or reference clock, preferably at substantially the same time as the test or arbitrary signal or pulse is received or detected at interface circuitry 38, 42. In this way, a time difference may be calculated to determine a signal propagation delay.

Alternately, such signal propagation delay may be determined by using logic analyzers. In this way, electrical probes may be physically applied at output lines from CAE tool 14 or simulator 16 and at various electrical contacts at interface circuitry 38, 42, such that test signals may be transmitted therebetween for direct measurements of signal delay.

Furthermore, another technique for determining signal propagation delay is by calculating an estimated or predicted signal delay value based on user-specified heuristics. For example, total estimated path delay may be based on a sum of expected or pre-determined path interconnect and component delays for signal or pulse propagation between interface circuitry 38, 42 and CAE tool 14 or simulator 16.

Thereafter, when certain paths are identified to have signal path delays that are longer than a user-specified duration, the functional stepping of prototype definition processes in simulator 16 or external systems 44, 45, 46, as well as the effective band-width of data signals transferred between CAE tool 14 or simulator 16 and external systems 44, 45, 46, may be adjusted to compensate for such identified signal path delays, thereby enabling synchronous functional co-operation therebetween.

Synchronous tuning may be accomplished, in part, by generating or varying a timing parameter, such as a reference signal or clock pulse, provided either in CAE tool 14 or external systems 44, 45, 46.

Additionally, to control operation of simulator 16, CAE 14 is provided with an interface or control software program which co-operates with simulator 16 and device drivers provided for operating interface circuit 40 in add-on circuit card 38. Preferably, such software program may cause simulation to begin, single-step, stop, be interrupted, polled or monitored.

In general, such software program serves to transfer data or signals between simulator 16 and target systems 44, 45, 46, and also to check such data or signals for correctness according to pre-specified data format and other parameters or rules. Preferably, such data or signal checking is done prior to simulation and includes the steps of verifying that each net name provided in the prototype definition validly exists, determining the size of the prototype definition, and verifying that simulation input signals are not improperly driving simulation output signals or registers that are non-tristable. As necessary, informative user messages are issued during such signal checking steps.

In particular, such software program includes model input/output file 28, which is generated from specified signal information provided in the prototype definition, model input/output parcer 26, which evaluates and formats the specified signal information, configuration module 24, which maps the formatted signal information into corresponding model representations, address generation module 18, which includes specified addresses for configuring the interface, run-time module 22 for module coordination, and C-language module (Programmable Logic Interface) 30, including specified routines which are usable by run-time module 22 for functional cooperation with simulator 16. Note that the routines are specified according to the C programming language.

Figure 3:
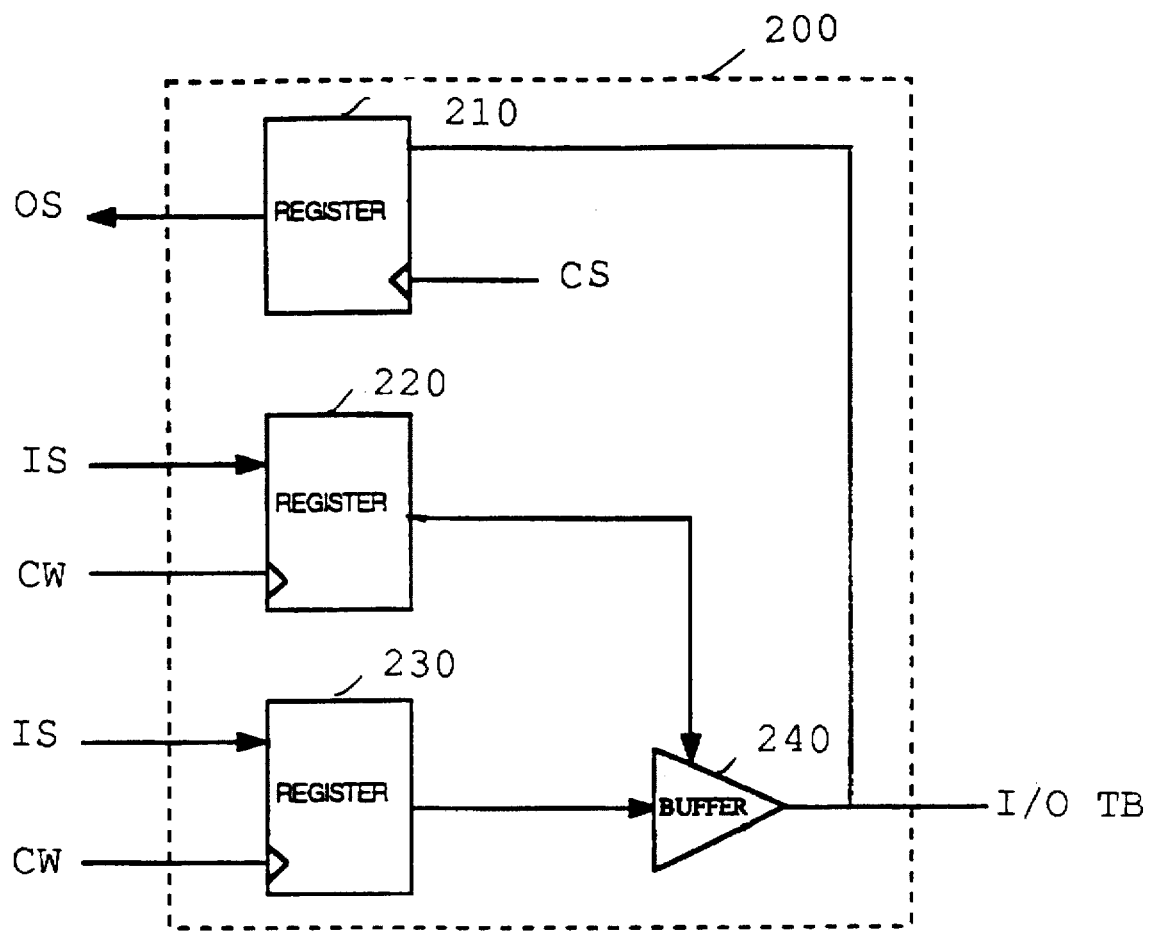
FIG. 3 is a circuit diagram representing one-bit interface pin of the present invention.

Referring now to FIG. 3, there is shown a circuit diagram representing an one-bit interface pin circuit 200 for providing communications between an input/output pin (I/Otb) of the target board 46 and input pins (Is) and an output pin (Os) of the simulator 12. The add-on circuit card 38 includes the interface circuit 40 which contains multiple number of the one-bit interface pin circuit 200 as determined by the number of interface pins needed to communicate with the target board 46. The one-bit interface pin 200 includes registers 210, 220, and 230 to transfer the functional operations of the target board 46 to the simulator 12 and to transfer the simulation functions from the simulator 12 to the target board 46. The data can be transferred unidirectionally or bi-directionally, depending on the selection of pins at the target board 38. If the target board 38 contains unidirectional pins, then the target board 46 sends data via the target board input/output pins to the add-on circuit card 38 in which the register 210 is enabled to receive data from the target board 46 while the register 220 is disabled. When the simulator 12 sends data to the add-on circuit card 38, the register 220 is enabled and the register 230 is loaded with a "0" or a "1" data bit generated from the simulator 16. If the target board 38 contains bi-directional pins, the register 230 may be enabled to send data from the simulator 12 to the target board 38. For data transfer from the target board 38 to the simulator 12, the register 210 is enabled while the register 220 and the register 230 are disabled via a buffer 240. The one-bit interface pin 200 also includes two clock pins, a write enable clock pin (Cw) and a system clock pin (Cs).

Figure 4:
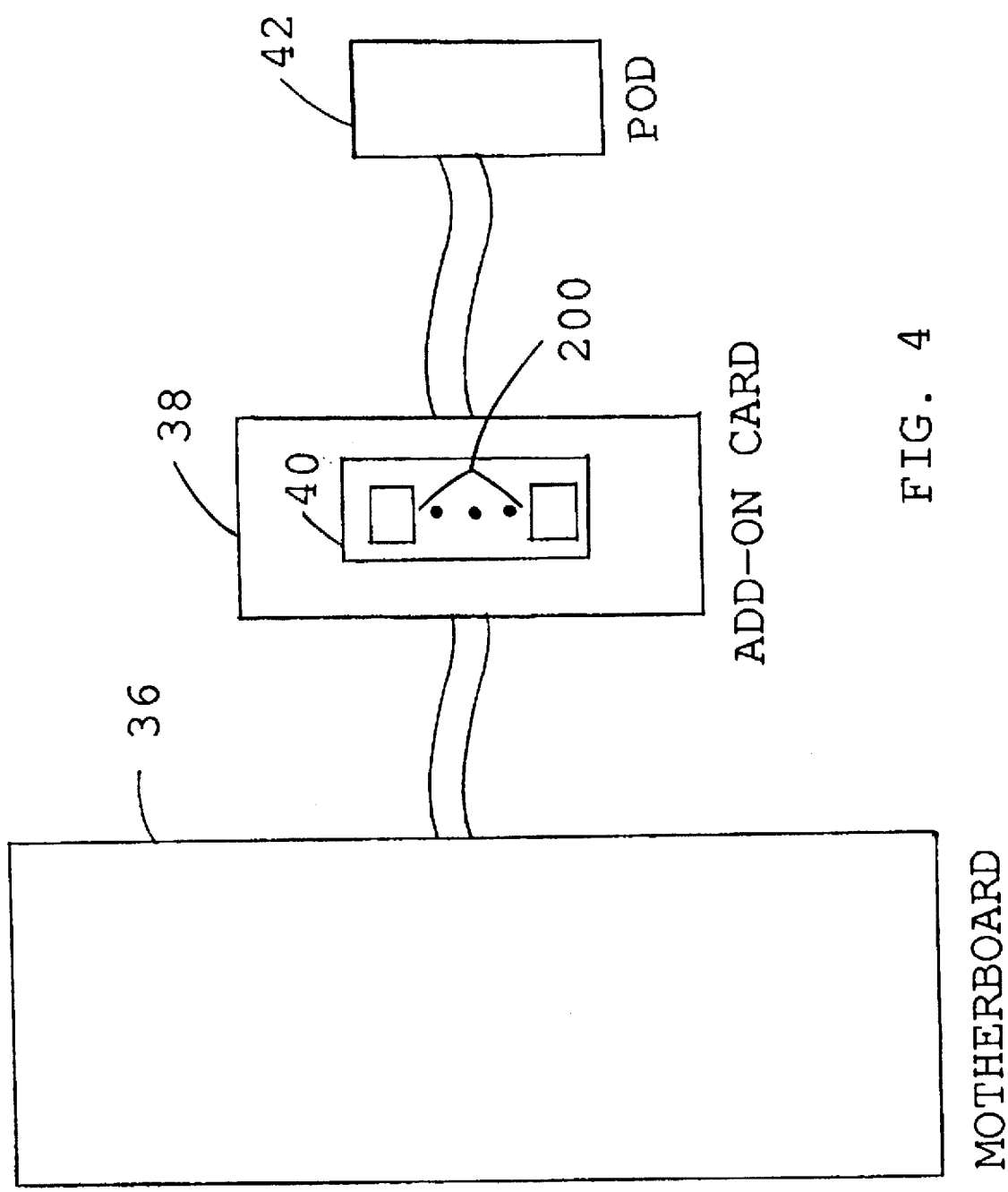
FIG. 4 illustrates the interface circuit coupling between a motherboard and a pod of the present invention.

Referring now to FIG. 4, the one-bit interface pin circuit 200 is replicated corresponding to the pin count and the pin configuration of a prototype integrated circuits where the prototype integrated circuits would be inserted into the female socket 48 as shown in FIG. 1. The pod 42 contains the same number of pins and in the same configuration as the female socket 48 to provide a cable connection between the target board 46 and the add-on circuit card 38. Data received from the pod 42 is transferred through the interface circuit 40 to the motherboard 36. In addition, data can be transferred bi-directionally from the motherboard 36 through the interface circuit 40 to the pod 42.

We claim:

1. An electronic verification system comprising:
   an external system;
   a bus circuit having a first port coupled to said external system for transferring data between said bus circuit and said external system and a second port; and
   a first simulation module coupled to said second port of said bus circuit for simulating and verifying a prototype definition of said external system.

2. The electronic verification system of claim 1 wherein said bus circuit includes an interface circuit for interfacing data transfer between said external system and said first simulation module.

3. The electronic verification system of claim 1 further comprising a circuit pod with two parts, the first part containing an adapter with a plurality of socket pins connected to said external system and the second part connected to said interface card.

4. The electronic verification system of claim 1 wherein the prototype definition comprises a plurality of simulation models, wherein at least one of the simulation models comprises a first-level simulation model, and at least one of the simulation models comprises a second-level simulation model.

5. The electronic verification system of claim 1 wherein the prototype definition comprises at least one simulation model.

6. The electronic verification system of claim 5 wherein each simulation model is defined according to a specified configuration.

7. The electronic verification system of claim 6 wherein data are transferred during simulation between the prototype definition and each external system according to a specified file format.

8. The electronic verification system of claim 5 wherein at least one of the simulation models comprises an analog component model, and at least one of the simulation models comprises a digital component model.

9. The electronic verification system of claim 5 wherein at least one of the simulation models comprises a memory component model.

10. The electronic verification system of claim 5 wherein each simulation model comprises at least one configurable signal path definition.

11. The electronic verification system of claim 1 wherein the simulation module is coupled to a hardware simulation accelerator.

12. The electronic verification system of claim 1 wherein the simulation module is coupled to a hardware modeler.

13. An electronic verification system comprising:
    an external system containing a socket for connection with a prototype system;
    a bus circuit having a first port coupled to said external system for transferring data between said bus circuit and said external system, and having a second port, said bus circuit includes an interface circuit;
    a first simulation module coupled to said second port of said interface circuit for simulating and verifying a prototype definition of said external system.

14. The electronic verification system of claim 13 wherein said prototype system includes a prototype semiconductor device.

15. The electronic verification system of claim 13 wherein said prototype system includes a connector for plugging-in a system.

16. The electronic verification system of claim 13 wherein said interface circuit further comprises:
    a buffer for sending data to an input/output pin of said external system;
    a first register with an input connected to the input/output pin of said external system and an output connected to said tool;
    a second register with an input from said tool and an output to said buffer for enabling or disabling the transfer function of said buffer;
    a third register with an input from said tool and an output connected to said buffer for transferring data to said buffer.

17. The electronic verification system of claim 13 wherein the external system comprises a second simulation module for simulating a second prototype definition.

18. The electronic verification system of claim 17 wherein the second simulation module is synchronized with the tool, such that the second prototype definition cooperates functionally with the prototype definition.

19. The electronic verification system of claim 18 wherein a third simulation module is coupled to the tool, wherein the third simulation module cooperates functionally with the second simulation module through the tool.

20. The electronic verification system of claim 17 wherein the second simulation module functionally cooperates with the first simulation module wherein the first simulation module causes a logic state to be set in the second prototype definition.

21. The electronic verification system of claim 17 wherein the external system comprises a hardware emulator.

22. The electronic verification system of claim 17 wherein the external system comprises a hardware modeler.

23. The electronic verification system of claim 17 wherein the external system comprises a hardware simulation accelerator.

24. The electronic verification system of claim 13 wherein the external system comprises a logic analyzer.

25. The electronic verification system of claim 13 wherein the external system comprises a functional tester.

26. The electronic verification system of claim 13 wherein the simulation module and each external system are implemented separately on different processors.

27. The electronic verification system of claim 13 wherein the simulation module and at least one external system are implemented on a single processor.

28. The electronic verification system of claim 13 wherein the simulation module and at least one external system are implemented in a set of processors.

29. The electronic verification system of claim 13 wherein the functional cooperation between the simulated prototype definition and each external system is substantially asynchronous.

30. The electronic verification system of claim 13 wherein a plurality of test signals are obtained from the first simulation module during simulation.

31. The electronic verification system of claim 13 wherein the first simulation module is implemented on a processor, and the interface comprises additional circuitry coupled to the processor.

32. The electronic verification system of claim 31 wherein the additional circuitry comprises a card coupled to each external system.

33. The electronic verification system of claim 32 wherein the card is coupled to a connector which is coupled to at least one socket in at least one of the external systems.

34. The electronic verification system of claim 32 wherein the card provides a signal path between at least one specified signal pin in each coupled socket to at least one specified signal pin in the simulated prototype definition.

35. The electronic verification system of claim 34 wherein the card connects a first conduction point in at least one external system to a second conduction point in the simulated prototype definition.

36. The electronic verification system of claim 35 wherein the connection comprises a bi-directional signal path.

37. The electronic verification system of claim 35 wherein the connection comprises a digital-to-analog converter (DAC) or analog-to-digital converter (ADC) circuit.

38. The electronic verification system of claim 35 wherein the connection enables inter-system signal communication, without user intervention to set-up interface parameters.

39. The electronic verification system of claim 34 wherein a signal path delay is determined for the signal path.

40. The electronic verification system of claim 39 wherein a timing parameter of one of the external systems is adjusted in response to the signal path delay.

41. The electronic verification system of claim 13 further comprising a software program for controlling the tool.

42. The electronic verification system of claim 41 wherein the software program causes the first simulation module to begin simulation.

43. The electronic verification system of claim 42 wherein the software program causes the first simulation module to stop simulation.

44. The electronic verification system of claim 43 wherein the software program causes the first simulation module simulation to be monitored.

45. The electronic verification system of claim 43 wherein type software program causes the first simulation module to single-step simulation.

46. The electronic verification system of claim 43 wherein the software program causes the first simulation module to modify a simulation process.

47. The electronic verification system of claim 46 wherein the modification comprises an interruption of the simulation process.

48. The electronic verification system of claim 46 wherein the modification comprises a polling of the simulation process.

49. The electronic verification system of claim 43 wherein the software program comprises a model input/output file which is generated from specified signal information provided in the prototype definition.

50. The electronic verification system of claim 49 wherein the software program further comprises a model input/output parcer which evaluates and formats the specified signal information.

51. The electronic verification system of claim 50 wherein the software program further comprises a configuration module which maps the formatted signal information into corresponding model representations.

52. The electronic verification system of claim 41 wherein the software program further comprises an address generation module including specified addresses for configuring the interface.

53. The electronic verification system of claim 42 wherein the software program further comprises a run-time module for module coordination.

54. The electronic verification system of claim 43 wherein the software program further comprises a routine module including specified routines which are usable by the run-time module for functional cooperation with the tool.

55. The electronic verification system of claim 13 wherein the first simulation module and the interface are assembled for stand-alone operation such that the assembly is substantially portable.

56. The electronic verification system of claim 13 wherein the first simulation module and the interface are assembled for embedded operation in one of the external systems such that the assembly is substantially dedicated for embedded operation.

57. The electronic verification system of claim 13 wherein the prototype definition is implemented in reconfigurable hardware logic.

58. The electronic verification system of claim 13 wherein the first simulation module is reconfigured for simulating a revised prototype definition, wherein the interface provides distributable access by the reconfigured first simulation module to at least one external system, thereby enabling functional cooperation between the revised prototype definition and each accessed external system.

59. An electronic verification system comprising:
a simulation module for simulating a prototype definition comprising a plurality of simulation models, wherein each simulation model is defined according to a specified configuration, at least one of the simulation models comprising a first-level simulation model, at least one of the simulation models comprising a second-level simulation model, each simulation model comprising at least one configurable signal path definition; and
an interface coupled to the tool;
wherein the interface provides distributable access by the simulation module to at least one external system, functional cooperation being enabled between the simulated prototype definition and each external system, and data are transferred during simulation between the prototype definition and each external system according to a specified file format.

60. The electronic verification system of claim 59 wherein one of the external systems comprises a second simulation module for simulating a second prototype definition, the second simulation module being synchronized with the tool, such that the second prototype definition functionally cooperates with the prototype definition.

61. The electronic verification system of claim 60 wherein the simulation module is implemented on a processor, and the interface comprises additional circuitry coupled to the processor, the additional circuitry comprising a card coupled to each external system, the card being coupled to a connector which is coupled to at least one socket in at least one of the external systems, the card providing a signal path between at least one specified conduction point in each coupled socket to at least one specified conduction point in the simulated prototype definition.

62. The electronic verification system of claim 60 further comprising a software program for controlling the tool, the software program causing the simulation module to begin, monitor, interrupt, poll or stop simulation, the software program comprising a model input/output file which is generated from specified signal information provided in the prototype definition, a model input/output parcer which evaluates and formats the specified signal information, a configuration module which maps the formatted signal information into corresponding model representations, an address generation module including specified addresses for configuring the interface, a run-time module for module coordination, and a routine module including specified routines which are usable by the run-time module for functional cooperation with the tool.

* * * * *